United States Patent [19]

Mayer

[11] Patent Number: 4,639,834
[45] Date of Patent: Jan. 27, 1987

[54] POWER SUPPLY

[75] Inventor: Hartwig Mayer, Neckargerach, Fed. Rep. of Germany

[73] Assignee: CEAG Licht- und Stromversorgungstechnik GmbH, Bochum, Fed. Rep. of Germany

[21] Appl. No.: 797,001

[22] Filed: Nov. 8, 1985

[30] Foreign Application Priority Data

Nov. 8, 1984 [DE] Fed. Rep. of Germany ....... 3440756

[51] Int. Cl.$^4$ .............................................. H05K 7/20
[52] U.S. Cl. ................... 361/388; 361/383; 361/399; 361/419
[58] Field of Search ................ 336/105; 363/141, 144; 307/150, 151; 361/331, 334, 380, 379, 381, 382, 383, 386, 388, 395, 399, 412, 417, 419, 427

[56] References Cited

U.S. PATENT DOCUMENTS

| 3,857,044 | 12/1974 | Papoi | 361/383 |
| 3,934,177 | 1/1976 | Horbach | 361/388 |
| 4,039,900 | 8/1977 | Roback | 361/388 |
| 4,365,288 | 12/1982 | Robe | 363/141 |
| 4,513,354 | 4/1985 | Abel | 361/399 |
| 4,519,015 | 5/1985 | Lin | 361/399 |

Primary Examiner—G. P. Tolin
Attorney, Agent, or Firm—Herbert L. Lerner; Laurence A. Greenberg

[57] ABSTRACT

A power supply includes a housing having a bottom, a partition at the bottom of the housing extended perpendicular to the bottom of the housing as seen in longitudinal direction of the partition subdividing the housing into first and second spaces, electronic modules including switching and control stages exclusively disposed in the first space and at least one other module disposed in the second space, a power transformer fastened to the partition, extended through an opening formed in the partition and having a primary side disposed in the first space in vicinity of the switching stage, and a circuit board spaced from the bottom of the housing having conductor runs forming connecting lines interconnecting the modules.

12 Claims, 6 Drawing Figures

POWER SUPPLY

The invention relates to a power supply having electronic modules disposed in a housing, such as rectifier filter modules and switching and control stages connected to each other by connecting lies, and a power transformer.

Such power supplies serve for supplying electric power with large current and low voltage, such as to a large computer. The internal circuit structure of such a power supply is as follows:

An a-c current which comes from the electric power network and is subject to line fluctuations is filtered and rectified in the power supply. A switching stage influenced by a control stage transforms the filtered and rectified current into a high-frequency wave current which is fed to the primary winding of a power transformer for instance by pulse width modulation. The secondary signal of the power transformer is rectified again in order to generate a unipolar pulse current, the clock frequency of which is a function of the on and off times of the transistor circuit. The pulse current is filtered and smoothed by a conventional LC-filter, for instance, so that the desired d-c output voltage and the d-c output current are generated.

These circuit configurations are known and the subject of the invention of the instant application is not the circuit configuration but the physical accommodation of the individual modules within a housing.

The dimensions of the individual components, particularly the transformer, the choke and the capacitors used in the circuit configuration are too large and therefore special attention should be given to the type of construction, i.e., the assembly. First of all, an attempt should be made to achieve a specially high packing density. However, the consequence of this is that the individual components can influence each other.

It has been known for some time, that it is not possible to construct a power supply, in which the individual components are accommodated in such a way that mutual interference is largely prevented. Due to the relationship of the individual modules, many connecting lines are required which makes the assembly very complicated. In order to obtain reproducible conditions, the connecting lines of the components or modules must always be installed in exactly the same place, so that they can always assume the same position. In practice, this can only be achieved with difficulty. In addition, the individual modules are not separated sufficiently from each other i.e. they are not spaced far enough from each other. A leakage of voltages can therefore be expected in the event of a cable break, which causes the separation of the high voltage regions from the low voltage regions to be bridged by the springing-back cable ends and which makes the occurrence of breakdowns with corresponding damage, entirely possible. In addition, it should be noted that due to the construction, the assembly and the replacement of individual components is very difficult because of the high cost of the wiring.

A power supply, in which at least the "cable confusion" is eliminated, has become known from German Published, Non-Prosecuted Application DE-OS 26 52 813. In that device, the individual module is placed in a definite physical relationship, so that the direction of current flow by and large occurs in meander form and generally in series. It can also be seen particularly from FIG. 4 of DE-OS 26 52 813 that the individual modules are held by support walls which also provide a separation of individual modules from each other.

A housing for a channel translator for carrier frequency systems, but not for power supplies, has become known from German Published, Prosecuted Application DE-AS 21 10 462. In that device the individual modules, i.e. the receiving channel, the transmitting channel and the signalling device are disposed in a clear cut manner and with a smoothly continuous information flow, which is also the case in the equipment according to Swiss Patent No. 256,367.

In all of these last-mentioned devices, extremely dense packing of the individual modules is not important. However, if such a power supply is to be used, such as on board ships or aircraft, then the equipment must be as small as possible as far as its overall dimensions are concerned, with optimum performance and an advantageous type of installation.

It is accordingly an object of the invention to provide a power supply which overcomes the hereinafore-mentioned disadvantages of the heretofore-known devices of this general type and in which the external dimensions are as small as possible, taking into consideration the fact that low voltage and high voltage modules are present within the equipment.

With the foregoing and other objects in view there is provided, in accordance with the invention, a power supply, comprising a housing having a bottom or base plate, a partition in the housing space at the bottom of the housing extended perpendicular to the bottom of the housing as seen in longitudinal direction of the partition subdividing the housing into first and second spaces or chambers, electronic modules including switching and control stages exclusively disposed in the first space and at least one other module such as a rectifier filter module disposed in the second space, a power transformer fastened to the partition, extended through an opening formed in the partition and having a primary side disposed in the first space in vicinity of the switching stage, and a circuit board spaced from the bottom of the housing having conductor runs forming connecting lines interconnecting the modules.

Therefore, according to the invention a first measure for reducing the external dimensions is the provision of a circuit board on the bottom or base plate of the housing, which practically covers the entire bottom; individual connecting lines leading to the individual modules are placed on the circuit board in the form of conductor runs or busses. On one hand, the "cable confusion" i.e. the difficulty of layering the cables is therefore eliminated while on the other hand, an exactly reproducible line configuration is achieved since this line configuration can be made by machine. In addition to a more clear cut structure of the equipment, this also leads to a reduced interference influence which can be defined exactly in advance, so that suitable reproducible measures can be taken in advance. In addition, cable breaks and breakdowns in the interior of the equipment caused thereby, will no longer occur.

In accordance with another feature of the invention, the bottom of the housing has two relatively longer and two relatively shorter sides and the partition is fastened to the bottom of the housing closer to one of the longer sides than the other so that the first space is elongated and narrow and has a smaller volume than the second space.

In accordance with an added feature of the invention, the at least one other module such as a power rectifier, choke, capacitor, resistor, etc. disposed in the larger volume second space has larger dimensions than the switching and control stages in the smaller volume first space. These are additional measures for improving or increasing the packing density.

In accordance with an additional feature of the invention, the partition has two lugs formed on opposite sides of the opening formed in the partition to which the power transformer is attached.

In accordance with a further feature of the invention, the power transformer has a winding an a magnet core with legs disposed outside and spaced from the winding defining a space therebetween, and the lugs are disposed in the space and essentially touch the winding for removing heat produced in the winding.

In accordance with again another feature of the invention, the legs have inner surfaces facing the winding, and including layers of soft elastic material each being disposed between one of the lugs and one of the inner surfaces for equalizing thermal expansions.

In accordance with again an additional feature of the invention, the power transformer extends beyond the partition into both of the spaces, and including casting resin attaching the power transformer to the partition.

In accordance with again an added feature of the invention, there is provided another circuit board supporting the switching stage, the primary side of the power transformer being directly adjacent and in contact with the other circuit board and the secondary side and its tap being disposed in the second space.

The partition subdivides the interior of the housing into a relatively narrow space and a comparably large space. The narrow space contains the switching stage and the controlling stage which are both fastened and fixed, on one hand, to a plug connector strip on the circuit board and, on the other hand, especially as far as the switching stage is concerned, to the partition. The switching stage is accommodated directly in the vicinity of the primary stage of the power transformer in the narrow space, so that the leads of the primary side of the power transformer make contact with the outputs of the switching stage placed directly on a circuit board. This likewise avoids longer cable connections.

Like all equipment of its type, the power supply includes a rectifier. In accordance with again a further feature of the invention, there is provided a heat sink connected to the partition and diodes connected to the heat sink forming a rectifier, the heat sink having groups of cooling fins being mutually spaced apart defining a U-shaped channel for receiving and guiding one of the at least one other modules.

In accordance with still another feature of the invention, the other module in the U-shaped channel is a conventional elongated choke at negative potential, the heat sink is at positive potential, and the cooling fins extend beyond the choke for reducing magnetic leakage flux of the choke as well as for increasing packing density.

In accordance with still an additional feature of the invention, the first space is smaller than the second space, and including another heat sink for the switching and control stages extended along the longitudinal direction thereof in the first space, the switching and control stages being disposed between the other heat sink and the partition.

In accordance with a concomitant feature of the invention, there are provided other circuit boards supporting the switching and control stages, and plug connectors mounting the other circuit boards on the first-mentioned circuit board and establishing contact between the switching and control stages and the connecting lines.

Other features which are considered as characteristic for the invention are set forth in the appended claims.

Although the invention is illustrated and described herein as embodied in a power supply, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
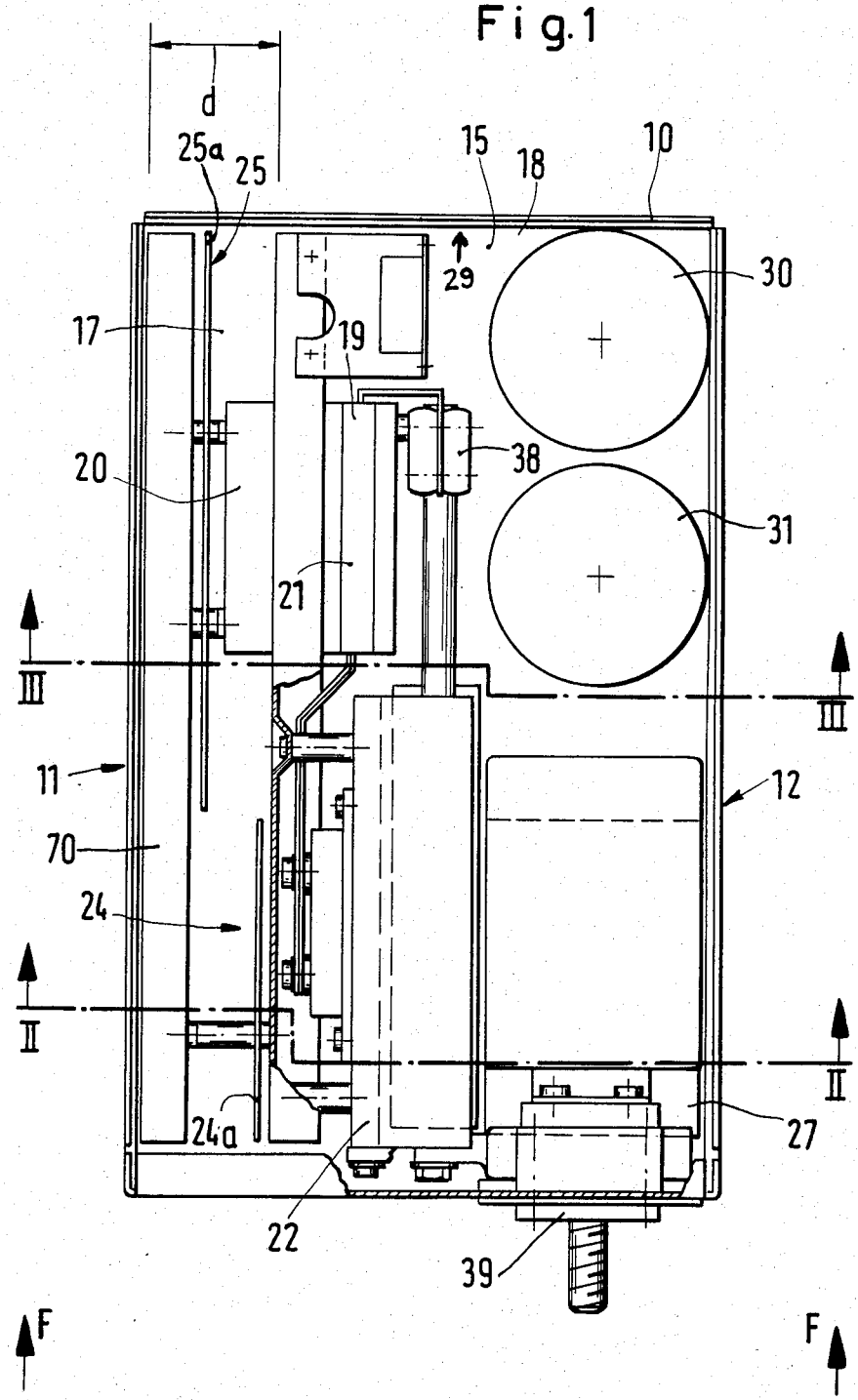
FIG. 1 is a diagrammatic, top-plan view of power supply equipment.
Figure 2:
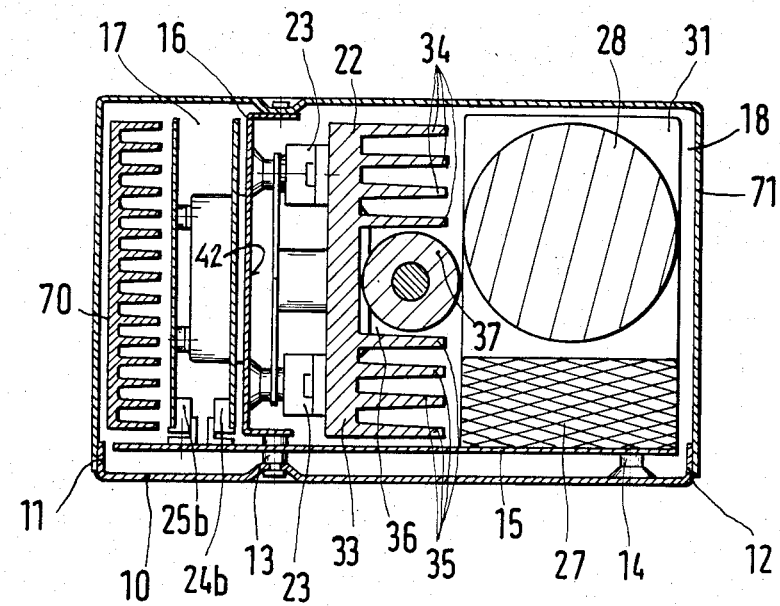
FIG. 2 is a cross-sectional view taken along the section line II—II of FIG. 1, in the direction of the arrows.
Figure 3:
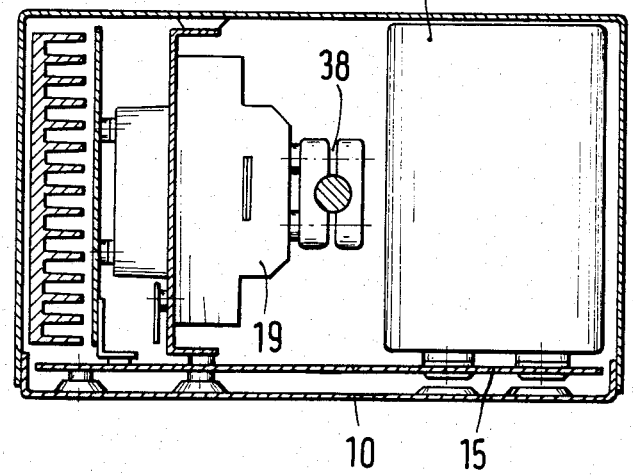
FIG. 3 is a cross-sectional view taken along the section line III—III of FIG. 1, in the direction of the arrows.

Referring now to the figures of the drawings in detail and first, particularly, to FIGS. 1-3 thereof, there is seen a power supply according to the invention, which will be referred to as "equipment" for short. The equipment includes a base plate or bottom 10 having longitudinal or longer edges 11 and 12 which are angled off so that the base plate 10 which may also be referred to as a base frame or bottom plate, forms a U, as seen in FIG. 2. The base plate 10 supports posts 13 and 14 which in turn support a circuit board 15 on which connecting lines in the form of conductor runs are placed: the connecting lines are not shown since circuit boards with conductor runs are known in the art. A partition is fastened to the base plate 10 at a relatively small distance d from the left-hand longitudinal edge 11. The partition subdivides the equipment into two spaces or chambers 17 and 18, the space 17 being elongated and very narrow as compared to the space 18.

The partition 16 which will be described in greater detail below, supports a power transformer 19, the primary region or side 20 of which is located in the space 17 and the secondary region or side 21 of which is located in the space 18. The power transformer 19 is mounted in the rear half of the equipment as seen from the front F. Toward the front, the partition 16 supports a heat sink 22 for cooling diodes 23 which are disposed between the partition 16 and the heat sink 22 and are connected as a rectifier. A control stage 24 is disposed on a circuit board 24a in the front region of the space 17, and a switching stage 25 which is controlled by the control stage 24 and generates a pulse width modulated high frequency pulse current, is disposed on a circuit board 25a in the vicinity of the power transformer 19. The individual components on the circuit boards 24a and 25a which form the control and switching stages are not shown for reasons of clarity. A filter and rectifier unit 27 in which the fed-in a-c current is rectified and filtered, is placed on the circuit board 15 in the vicinity of the front of the space 18.

Above the filter and rectifier unit which will simply be referred to as the "unit" below, there is a first capacitor 28 and two further capacitors 30 and 31 fastened to the circuit board 15 in the space remaining between the power transformer 19 and the right-hand longitudinal edge 12 and between the capacitor 28 and a rear transverse edge 29.

The electrical interconnections of the individual components and modules are of secondary importance, so that this does not have to be discussed in detail. It is only important that the control and switching stages 24, 25, i.e. the modules with the "small volume" are located in the space 17 and the modules with the "large volume" are located in the space 18. The connecting lines are the conductor runs on the circuit board 15, and electrical contact from the switching and control stages to the conductor runs is made by connector strips or plug connectors 24b, 25b which additionally provide the mechanical mounting of the circuit boards 24a, 25a on the circuit board 15.

It can be seen from FIG. 2, that the heat sink 22 has a flat plate 33 on one side of which two groups of cooling fins 34, 35 are formed. A channel 36 is formed between the groups of fins 34, 35 and a conventional elongated cylindrical choke 37 extends in the channel 36. One end of the choke 37 is connected to the power transformer by means of a terminal connection 38 and the other end of the choke is connected to an external terminal 39. Since the cooling fins 34 and 35 cover two sides of the choke 37 or protrude beyond the choke for certain mechanical constructions of the choke, a considerable reduction of the magnetic leakage field of the choke is obtained in a particularly advantageous manner.

FIG. 3 shows the base plate or bottom 10, the circuit board 15 mounted or fastened on the base plate as well as the power transformer 19 and the capacitor 31. A further heat sink 70 is accommodated in the space 17. The heat sink 70 extends directly adjacent the left-hand longitudinal edge 11 and parallel thereto through the entire space 17 and serves for cooling the switching and control stages and for the overall heat removal.

Figure 4:
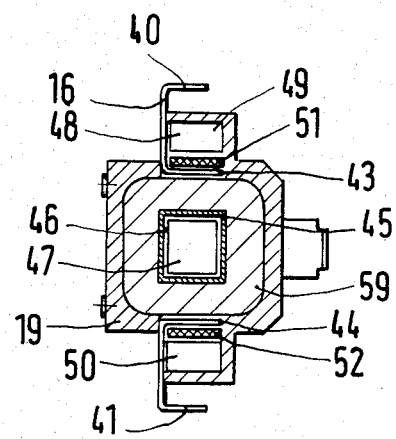
FIG. 4 is a cross-sectional view taken along the section line IV—IV of FIG. 5, in the direction of the arrows.

FIG. 4 is a cross-sectional view showing how the power transformer 19 is fastened to the partition 16. The partition 16 is an elongated, planar part having a large surface area and bent portions 40 and 41 at the longitudinal edges thereof, so that the overall partition forms a U-shape, the aperture of which is open toward the space 18. In the rear region, the partition 16 has an opening 42 which is formed by punching out and bending off lugs 43 and 44. The transformer 19 to be assembled has a coil form 45 which is shown diagrammatically in FIG. 4 as having an opening 46 in the central region thereof, through which the center leg 47 of a suitably assembled core 49 extends. Two outer legs 48 and 50 of the core are located outside the coil winding 59, where respective buffers 51 and 52 of elastic material are additionally inserted at the inner surface of the outer legs 48 and 50. The unit formed in this manner is pushed over the two straps or lugs 43 and 44 in such a manner that the two straps or lugs are respectively located between the coil form 45 and the inserted buffers 51 and 52. After this assembly, the partition 16 is placed in an injection or casting mold; the power transformer is surrounded with a casting resin encapsulation 53 shown in FIG. 5, so that it becomes a quasiintegral component of the partition. The two lugs 43 and 44 which are in direct contact with the coil form and the winding, serve as elements for direct removal of the heat produced in the interior of the winding, from the transformer to the outside. The winding is, of course, insulated from the lugs so that no short circuits can occur.

Figure 5:
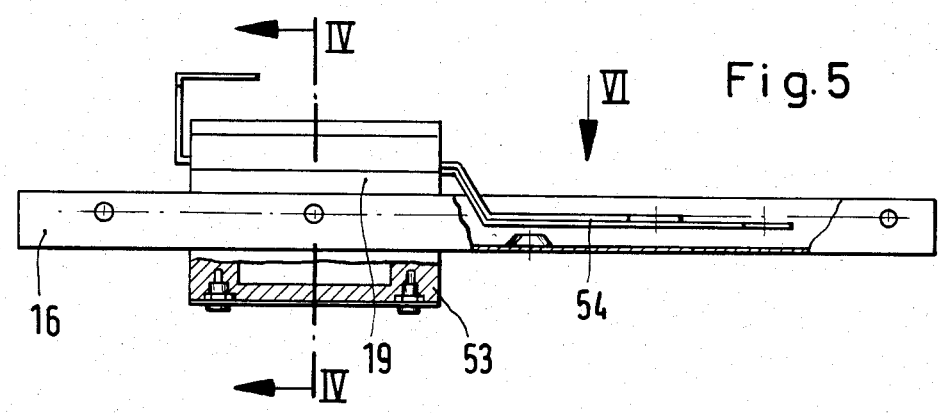
FIG. 5 is a top-plan view of a partition with a power transformer inserted.

FIG. 5 shows the equipment from the top with the transformer 19 and the partition 16. It is seen that connecting leads 54 in the form of ribbons are brought out from the transformer or the casting resin encapsulation 53 and are then firmly connected to the diodes 23 attached to the heat sink 22. The connecting leads 54 branch off into branch lugs 55, 56, 57 and 58, extending substantially perpendicular to the longitudinal extent of the connecting conductors or leads 54, as seen in FIG. 6.

Figure 6:
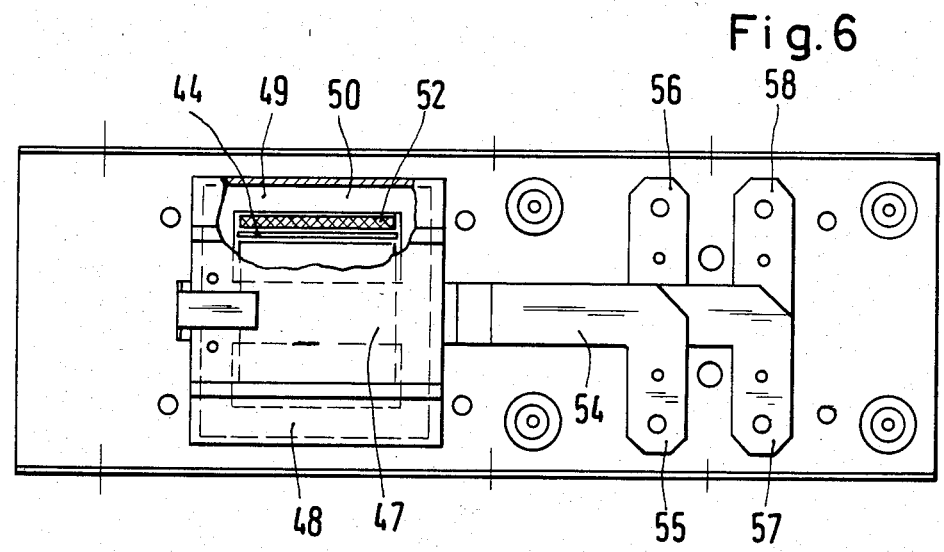
FIG. 6 is a side-elevational view as seen along the direction of the arrow VI—VI of FIG. 5.

FIG. 6 shows the transformer partially in cross section, the strap 44 and the buffer 52 being visible. The core 49 has the center leg 47 in the middle and the outer legs 48 and 50.

The power supply equipment is covered up at the top thereof by an upper housing part 71 fastened to the bottom of the housing, as seen in FIG. 2.

The foregoing is a description corresponding in substance to German Application P 34 40 756.1, dated Nov. 8, 1984, the International priority of which is being claimed for the instant application, and which is hereby made part of this application. Any material discrepancies between the foregoing specification and the aforementioned corresponding German application are to be resolved in favor of the latter.

I claim:

1. Power supply, comprising a housing having a bottom, a partition at said bottom of said housing extended perpendicular to said bottom of said housing as seen in longitudinal direction of said partition subdividing said housing into first and second spaces, electronic modules including switching and control stages exclusively disposed in said first space and at least one other module disposed in said second space, a power transformer fastened to said partition, extended through an opening formed in said partition and having a primary side disposed in said first space in vicinity of said switching stage, and a circuit board spaced from said bottom of said housing having conductor runs forming connecting lines interconnecting said modules.

2. Power supply according to claim 1, wherein said bottom of said housing has two relatively longer and two relatively shorter sides and said partition is fastened to said bottom of said housing closer to one of said longer sides than the other so that said first space is elongated and narrow and has a smaller volume than said second space.

3. Power supply according to claim 2, wherein said at least one other module disposed in said larger volume second space has larger dimensions than said switching and control stages in said smaller volume first space.

4. Power supply according to claim 1, wherein said partition has two lugs formed on opposite sides of said opening formed in said partition to which said power transformer is attached.

5. Power supply according to claim 4, wherein said power transformer has a winding and a magnet core with legs disposed outside and spaced from said winding defining a space therebetween, and said lugs are disposed in said space and touch said winding for removing heat produced in said winding.

6. Power supply according to claim 5, wherein said legs have inner surfaces facing said winding, and including layers of soft elastic material each being disposed between one of said lugs and one of said inner surfaces for equalizing thermal expansions.

7. Power supply according to claim 1, wherein said power transformer extends beyond said partition into both of said spaces, and including casting resin attaching said power transformer to said partition.

8. Power supply according to claim 7, including another circuit board supporting said switching stage, said primary side of said power transformer being directly adjacent and in contact with said other circuit board.

9. Power supply according to claim 1, including a heat sink connected to said partition and diodes connected to said heat sink forming a rectifier, said heat sink having groups of cooling fins being mutually spaced apart defining a U-shaped channel for receiving one of said at least one other modules.

10. Power supply according to claim 9, wherein said one other module in said U-shaped channel is an elongated choke at negative potential, said heat sink is at positive potential, and said cooling fins extend beyond said choke for reducing magnetic leakage flux of said choke as well as for increasing packing density.

11. Power supply according to claim 9, wherein said first space is smaller than said second space, and including another heat sink for said switching and control stages extended along the longitudinal direction thereof in said first space, said switching and control stages being disposed between said other heat sink and said partition.

12. Power supply according to claim 1, including other circuit boards supporting said switching and control stages, and plug connectors mounting said other circuit boards on said first-mentioned circuit board and establishing contact between said switching and control stages and said connecting lines.

* * * * *